United States Patent
Nelson et al.

(10) Patent No.: US 7,719,856 B2
(45) Date of Patent: May 18, 2010

(54) CAM SHAPED HINGES

(75) Inventors: Michael J. Nelson, Prior Lake, MN (US); Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 12/356,295

(22) Filed: Jan. 20, 2009

(65) Prior Publication Data

US 2009/0310326 A1    Dec. 17, 2009

Related U.S. Application Data

(60) Provisional application No. 61/060,581, filed on Jun. 11, 2008.

(51) Int. Cl.
*H05K 5/00* (2006.01)

(52) U.S. Cl. .................................. 361/807; 361/755

(58) Field of Classification Search .............. 361/730, 361/752, 790, 797, 800, 807, 810
See application file for complete search history.

(56) References Cited

U.S. PATENT DOCUMENTS

| | | | |
|---|---|---|---|
| 4,166,195 A | 8/1979 | Schwab | |
| 5,134,250 A | 7/1992 | Caveney et al. | |
| 6,082,441 A | 7/2000 | Boehmer et al. | |
| 6,107,575 A * | 8/2000 | Miranda | 174/101 |
| 6,437,244 B1 * | 8/2002 | Vander Velde | 174/68.3 |
| 6,835,891 B1 * | 12/2004 | Herzog et al. | 174/66 |
| 6,968,647 B2 | 11/2005 | Levesque et al. | |
| 6,972,367 B2 | 12/2005 | Federspiel et al. | |
| 7,225,586 B2 | 6/2007 | Levesque et al. | |

* cited by examiner

*Primary Examiner*—Hung S Bui
(74) *Attorney, Agent, or Firm*—Fogg & Powers LLC

(57) ABSTRACT

A hinge comprises a first member having a protrusion, wherein the protrusion has a cam profile shape; and a second member having a cavity operable to receive the protrusion, wherein a cam profile shape of the cavity corresponds to the cam profile shape of the protrusion such that, when the protrusion is in a first position, a gap is present between the second member and the protrusion and, when the protrusion is in a second position, substantially no gap is present between the second member and the protrusion.

23 Claims, 6 Drawing Sheets

CAM SHAPED HINGES

CROSS-REFERENCE TO RELATED CASES

This application is related to the following United States patent applications, all of which are hereby incorporated herein by reference:

U.S. provisional patent application Ser. No. 61/060,581 (entitled "CAM SHAPED HINGES") filed on Jun. 11, 2008 and which is referred to herein as the '581 Application. The present application hereby claims priority, under 35 U.S.C. §119(e), to U.S. Provisional Patent Application No. 61/060,581;

U.S. patent application Ser. No. 12/137,322 (entitled "COMMUNICATION MODULES") filed on Jun. 11, 2008 and which is referred to herein as the '1027 Application;

U.S. patent application Ser. No. 12/137,297 (entitled "APPARATUS FOR MOUNTING A MODULE AND ENABLING HEAT CONDUCTION FROM THE MODULE TO THE MOUNTING SURFACE") filed on Jun. 11, 2008 and which is referred to herein as the '1028 Application;

U.S. provisional patent application Ser. No. 61/060,589 (entitled "SUSPENSION METHOD FOR COMPLIANT THERMAL CONTACT OF ELECTRONICS MODULES") filed on Jun. 11, 2008 and which is referred to herein as the '1029 Application;

U.S. patent application Ser. No. 12/137,307 entitled "ANGLED DOORS WITH CONTINUOUS SEAL") filed on Jun. 11, 2008 and which is referred to herein as the '1030 Application;

U.S. provisional patent application Ser. No. 61/060,523 (entitled "L-SHAPED DOOR WITH 3-SURFACE SEAL FOR ENDPLATES") filed on Jun. 11, 2008 and which is referred to herein as the '1031 Application;

U.S. provisional patent application Ser. No. 61/060,576 (entitled "L-SHAPED DOORS WITH TRAPEZOIDAL SEAL") filed on Jun. 11, 2008 and which is referred to herein as the '1032 Application;

U.S. patent application Ser. No. 12/137,309 (entitled "VENTURI FAN-ASSISTED COOLING OF HEAT SINK") filed on Jun. 11, 2008 and which is referred to herein as the '1033 Application;

U.S. provisional patent application Ser. No. 61/060,547 (entitled "COMBINATION EXTRUDED AND CAST METAL OUTDOOR ELECTRONICS ENCLOSURE") filed on Jun. 11, 2008 and which is referred to herein as the '1034 Application;

U.S. provisional patent application Ser. No. 61/060,584 (entitled "SYSTEMS AND METHODS FOR CABLE MANAGEMENT") filed on Jun. 11, 2008 and which is referred to herein as the '1035 Application;

U.S. patent application Ser. No. 12/137,313 (entitled "SOLAR SHIELDS") filed on Jun. 11, 2008 and which is referred to herein as the '1038 Application;

U.S. provisional patent application Ser. No. 61/060,501 (entitled "APPARATUS AND METHOD FOR BLIND SLOTS FOR SELF DRILLING/SELF-TAPPING SCREWS") filed on Jun. 11, 2008 and which is referred to herein as the '1039 Application;

U.S. provisional patent application Ser. No. 61/060,593 (entitled "THERMAL MANAGEMENT") filed on Jun. 11, 2008 and which is referred to herein as the '1040 Application;

U.S. provisional patent application Ser. No. 61/060,762 (entitled "SERF BOARD COMPONENTS") filed on Jun. 11, 2008 and which is referred to herein as the '1062 Application;

U.S. provisional patent application Ser. No. 61/060,740 (entitled "PULL-OUT SHELF FOR USE IN A CONFINED SPACE FORMED IN A STRUCTURE") filed on Jun. 11, 2008 and which is referred to herein as the '1064 Application;

U.S. patent application Ser. No. 11/627,255, entitled "A DISTRIBUTED REMOTE BASE STATION SYSTEM" (the '829 Application); and U.S. patent application Ser. No. 11/627,251, entitled "MODULAR WIRELESS COMMUNICATIONS PLATFORM" (the '828 Application).

BACKGROUND

In a communications system, such as a distributed antenna system, it is often necessary to place a remote unit in an outdoor area. For example, a remote unit may be placed in an outdoor stadium, park, etc. Placing a remote unit outdoors potentially exposes the unit to adverse weather conditions, such as rain, wind, etc. In order to protect the electronic components of the remote unit, the electronic components are typically placed in a enclosure which is sealed watertight. While enclosures protect the electronic components, conventional enclosures also make it difficult to access the components during installation or maintenance by blocking or providing small access areas to one or more sides of the electronic components.

Therefore, for the reasons stated above and for other reasons which shall become apparent to one of ordinary skill in the art upon reading and studying the present application, there is a need in the art for an improved electronics enclosure which provides greater ease of access to electronic components contained therein.

SUMMARY

In one embodiment, a hinge is provided. The hinge comprises a first member having a protrusion, wherein the protrusion has a cam profile shape; and a second member having a cavity operable to receive the protrusion, wherein a cam profile shape of the cavity corresponds to the cam profile shape of the protrusion such that, when the protrusion is in a first position, a gap is present between the second member and the protrusion and, when the protrusion is in a second position, substantially no gap is present between the second member and the protrusion.

DRAWINGS

Features of various embodiments of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

In accordance with common practice, the various described features are not drawn to scale but are drawn to emphasize specific features. Like reference numbers and designations in the various drawings indicate like elements.

DETAILED DESCRIPTION

Figure 1:
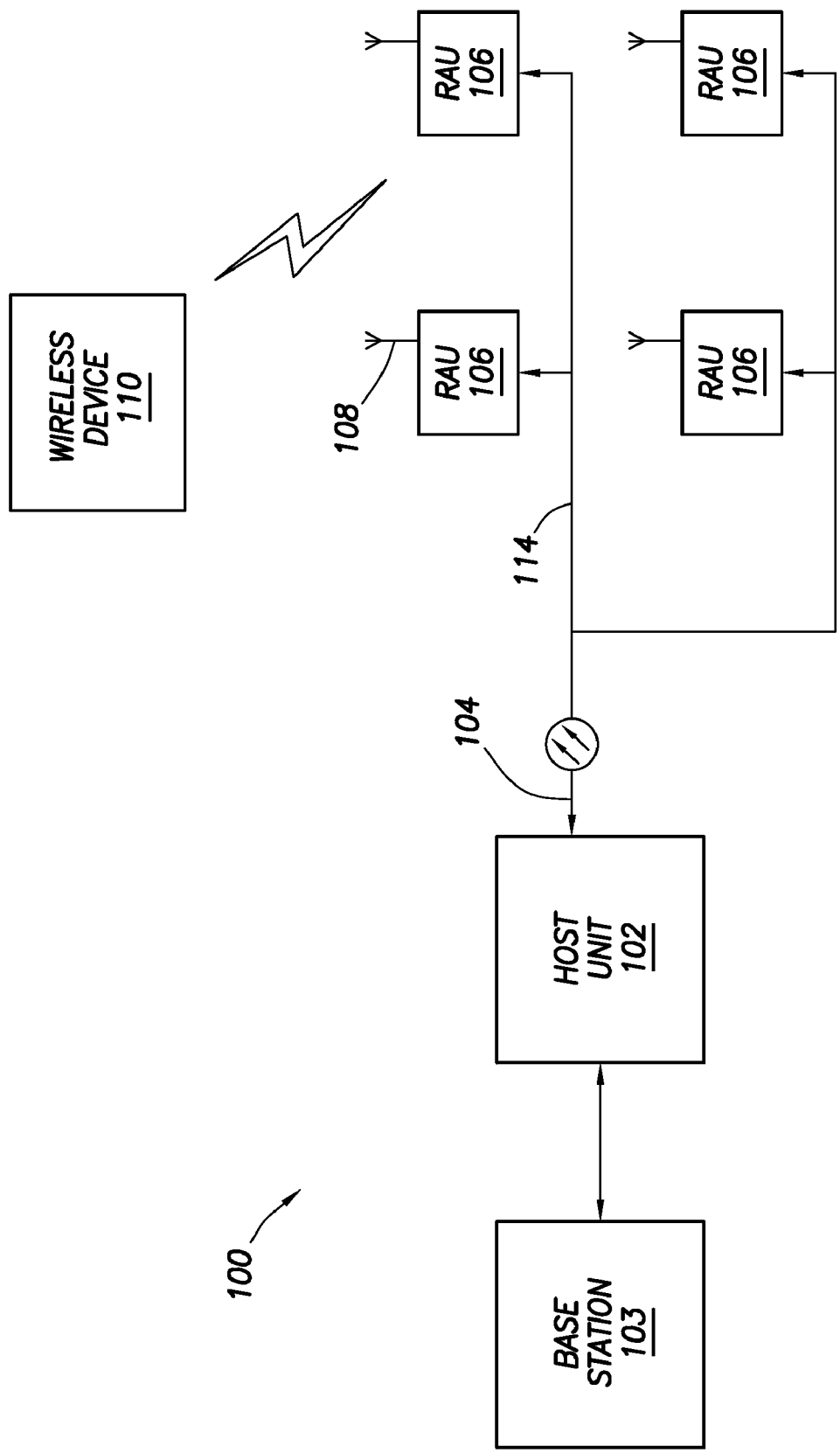
FIG. 1 is a block diagram of one embodiment of a distributed antenna system.

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical, and electrical changes may be made without departing from the scope of the present invention. Furthermore, the method presented in the drawing figures or the specification is not to be construed as limiting the order in which the individual steps may be performed. The following detailed description is, therefore, not to be taken in a limiting sense.

Some embodiments of the present invention are used in a distributed antenna system (DAS), such as DAS 100 in FIG. 1, which implements a modular wireless platform. The modular wireless platform enables a system facilitator to easily and inexpensively adapt the wireless system for use with different data transport mechanisms, frequency bands, communication technologies, and intelligence distribution. The host unit 102 is located near a central node and facilitates transmission/reception of information to/from remote units 106 which are located remotely with an accompanying antenna 118. The remote units 106 function to transmit/receive transmissions from the host unit and transmit/receive wireless signals over accompanying antenna to mobile costumers.

In such embodiments, the host unit 102 and remote units 106 have a modular design and defined interfaces that allow components to be removed and installed to adapt to the needs of the service providers. Therefore, it may be necessary to periodically open and close enclosures which house the installed components either to upgrade the components or perform maintenance on the components. For instance, there are different radio frequency (RF) modules, and each RF module is designed for a particular technology and frequency band. Thus, technology and frequency band adjustments can be made by simply replacing the conversion module in the host unit or remote unit. One exemplary RF module is described in the '1027 application. Additional details regarding an exemplary modular platform and distributed antenna system are described in the '828 and '829 applications.

Additionally, the host unit 102 and remote units 106 are designed to allow different transport mechanisms 114 between the host unit and remote units. For example, the same host unit 102 and remote units 106 that use fiber optic for inter-unit transmission can be adapted to use millimeter wave (MMW) wireless transmission, such as E band communications, instead of or concurrently with the fiber optic. Finally, wireless processing functionality can be placed all on a base station 103 near the central node, or the functionality can be distributed throughout each of the remote units 106. The flexibility to modify the functionality of each remote unit 106 allows the wireless platform to support centralized base stations 103 and distributed base stations, either separately or concurrently.

As stated above, remote units 106 have a modular design and defined interfaces that allow components to be removed and installed to adapt to the needs of the service providers. In order to facilitate the removal, installation, and maintenance of the modules in remote units 106, system 100 uses enclosures for remote units 106 which provide ease of access to the modules.

Figure 2:
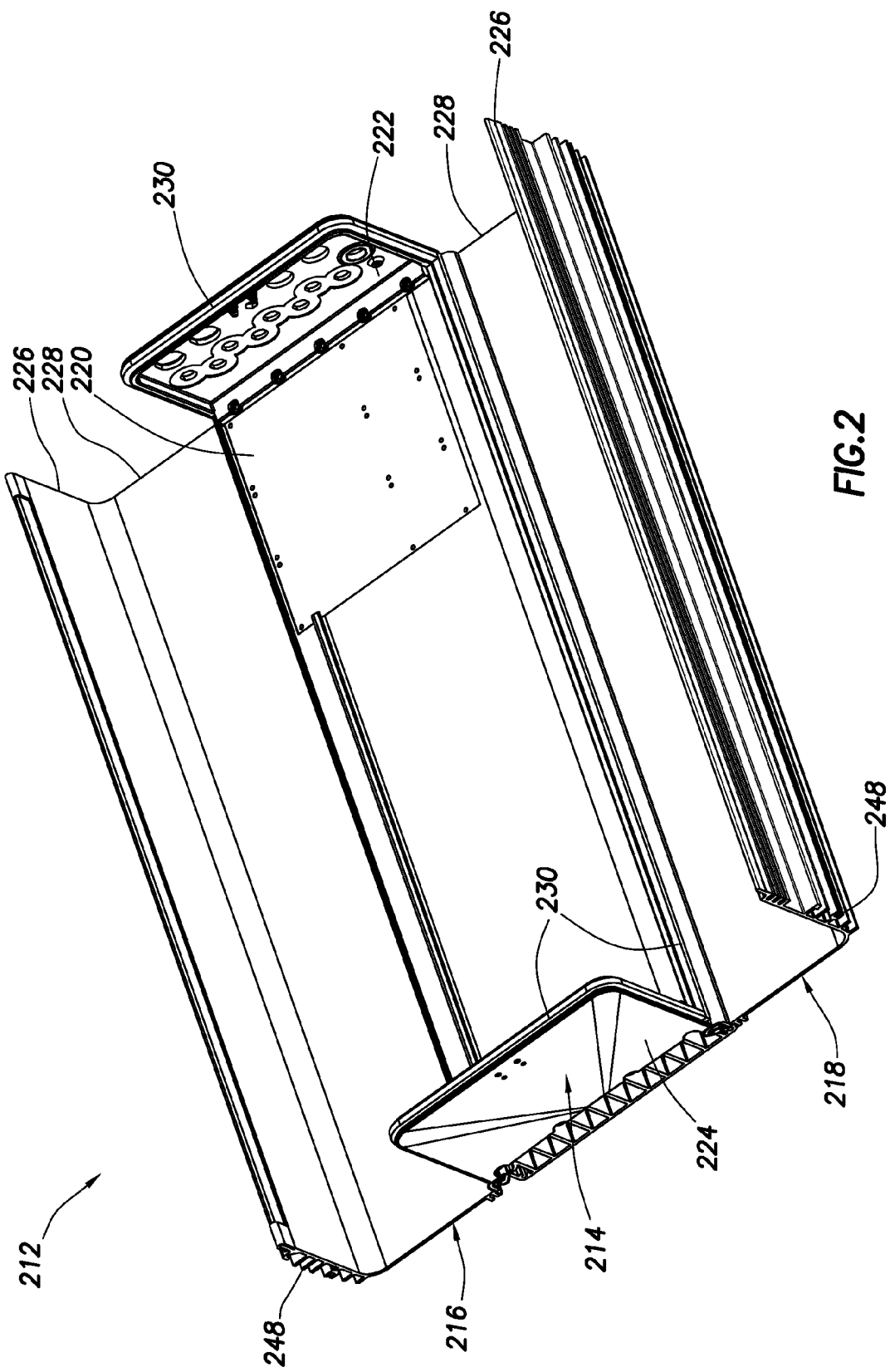
FIG. 2 is an isometric view of one embodiment of an electronics enclosure.

FIG. 2 is an isometric view of an exemplary enclosure 212. Enclosure 212 includes a base 214, a first side wall 216, and a second side wall 218 (also referred to herein as enclosure doors 216 and 218). Base 214 is comprised of a back wall 220, a first end plate 222, and a second end plate 224. In some embodiments, back wall 220, first end plate 222, and second end plate 224 are manufactured as separate segments which are then coupled together to from base 214. In other embodiments, back wall 220, first end plate 222 and second end plate 224 are both manufactured as continuous segments. In addition to securing modules in place, back wall 220 is operable to provide a heat sink for electronics modules located in enclosure 212. Similarly, in some embodiments, side walls 216 and 218 are configured with fins 248 to provide additional heat sinks to modules located inside enclosure 212. Consequently, base 214 and side walls 216 and 218 are comprised of any appropriate thermally conductive material for outdoor weather conditions including, but not limited to, metals such as Aluminum and Copper. In particular, in this embodiment, base 214 and side walls 216 and 218 are comprised of Aluminum.

In addition, base 214 and/or side walls 216 and 218 are manufactured, in some embodiments, through an extrusion process. Extruding base 214 and side walls 216 and 218 enables the walls and base to be manufactured with varying lengths based on the needs of service providers. In other embodiments, however, other manufacturing processes, such as die casting, are used to manufacture base 214 and side walls 216 and 218. Each of side walls 216 and 218 is comprised of two sections 226 and 228. Section 226 and 228 together form an angle which matches the shape of first end plate 222 and second end plate 224. In particular, in the example shown in FIG. 2, sections 226 and 228 form an approximately 90 degree angle to match the angle of the substantially rectangular shape of second end plate 224 and first end plate 222. In this manner, side walls 216 and 218 are able to abut the exposed perimeter of base 214 in order to close the enclosure. As used herein, the exposed perimeter of base 214 refers to the edges of back wall 220, second end plate 224, and first end plate 222 which are exposed when enclosure 212 is opened. Additional details and exemplary embodiments of enclosures are described in more detail in the '1030 application.

Furthermore, hinges are implemented which facilitate the rotation of the side walls 216 and 218 in order to open and close the enclosure 212 as described above and in the '1030 application. In particular, the hinges are comprised of a cavity in the base 214 and a corresponding protrusion of the side walls 216 and 218 as shown below. Thus, when the side walls 216 and 218 are extruded, the protrusions are simultaneously extruded in the same process. As a result, hinges 234 extend the length of base 214 and side walls 216 and 218, enabling hinges of variable length based on the needs of service providers. Manufacturing the hinges as part of other components also results in a reduction in manufacturing costs.

Figure 3:
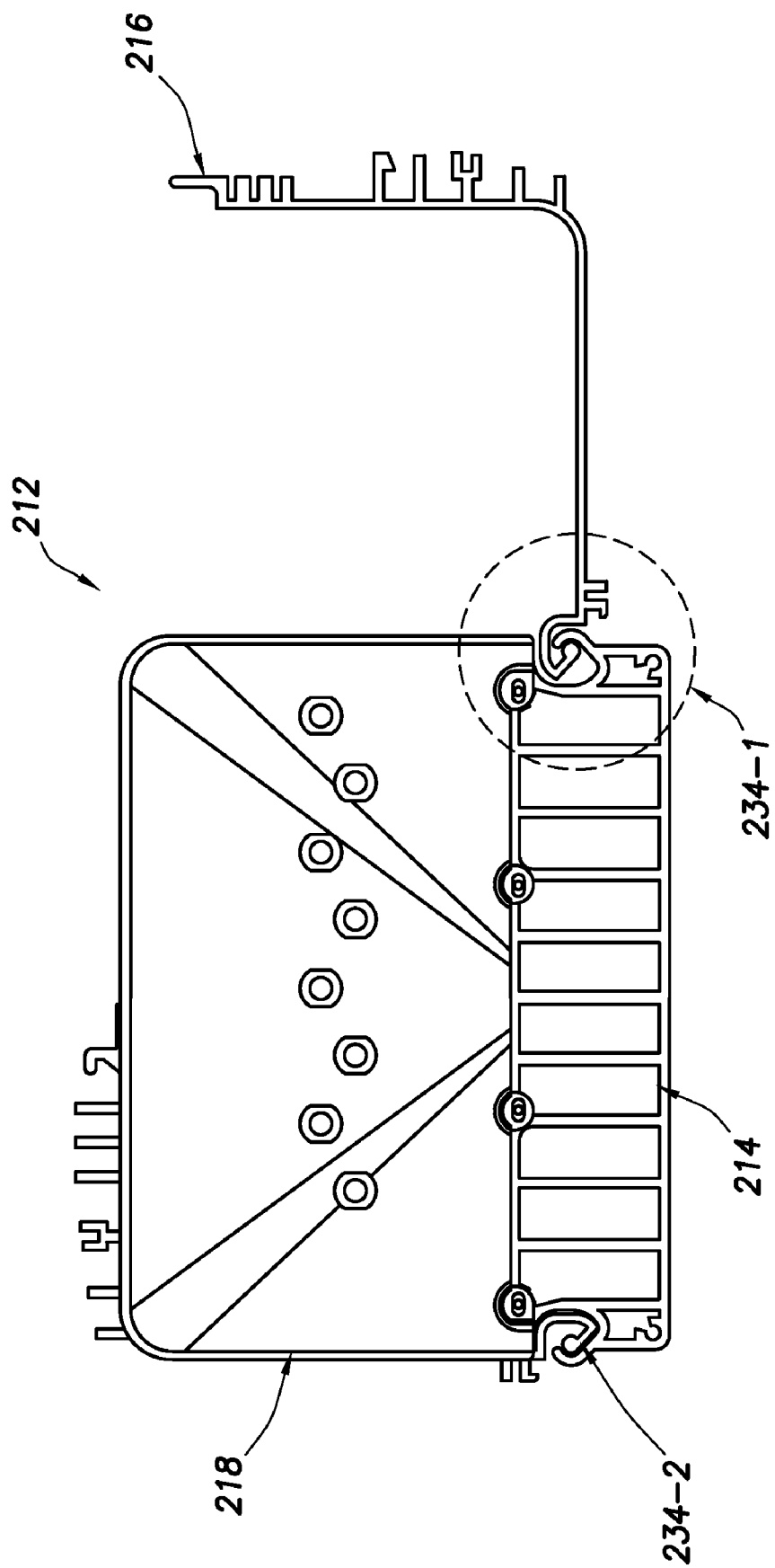
FIG. 3 is a side view of one embodiment of an electronics enclosure.

FIG. 3 is a top view of an electronics enclosure 212. As can be seen in FIG. 3, enclosure 212 includes two hinges 234 which enable side walls 216 and 218 to rotate in order to open and close enclosure 212. Enclosure 234-1 is in the open position in FIG. 3 while enclosure 234-2 is in the closed position. Enlarged views of the open and closed positions are shown in FIGS. 4 and 5 below, respectively.

Figure 4:
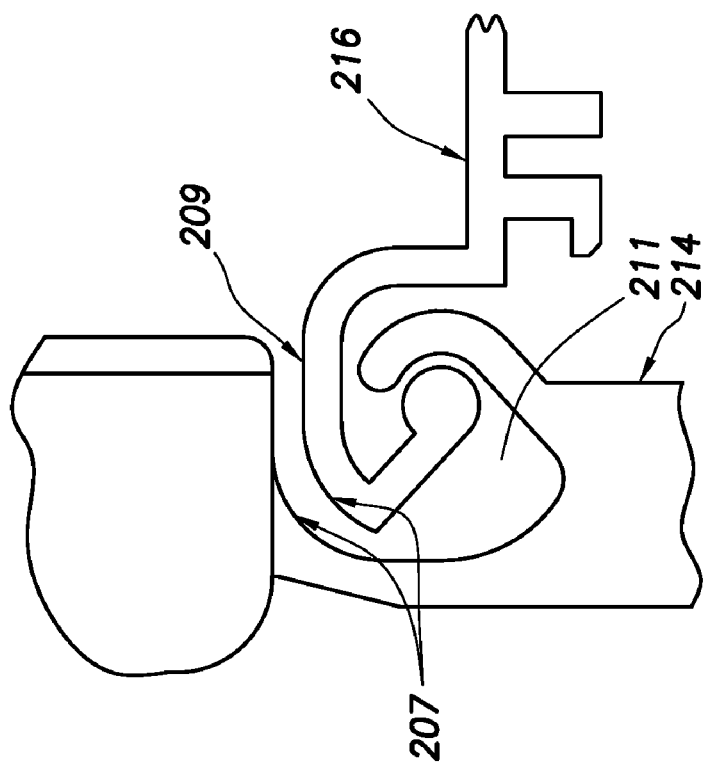
FIG. 4 is an enlarged view of one embodiment of a hinge in the open position.

FIG. 4 shows an enlarged view of enclosure 234-1 in the open position. As can be seen in FIG. 4, side wall 216 includes a protrusion 209 and base 214 includes a cavity 211. Protrusion 209 and cavity 211 are formed during manufacture of side wall 216 and base 214, respectively. For example, in embodiments utilizing extrusion processes, protrusion 209 and cavity 211 are extruded with the side wall 216 and base 214, respectively. Due to the bow and twist associated with the extrusion, a large degree of nominal clearance is needed to assemble hinge 234. As can be seen in FIG. 4, due to the shape of cavity 211 and protrusion 209, a gap 207 exists between protrusion 209 and cavity 211 when in the open position. Gap 207 provides sufficient clearance for the hinge 234 to be assembled.

Figure 5:
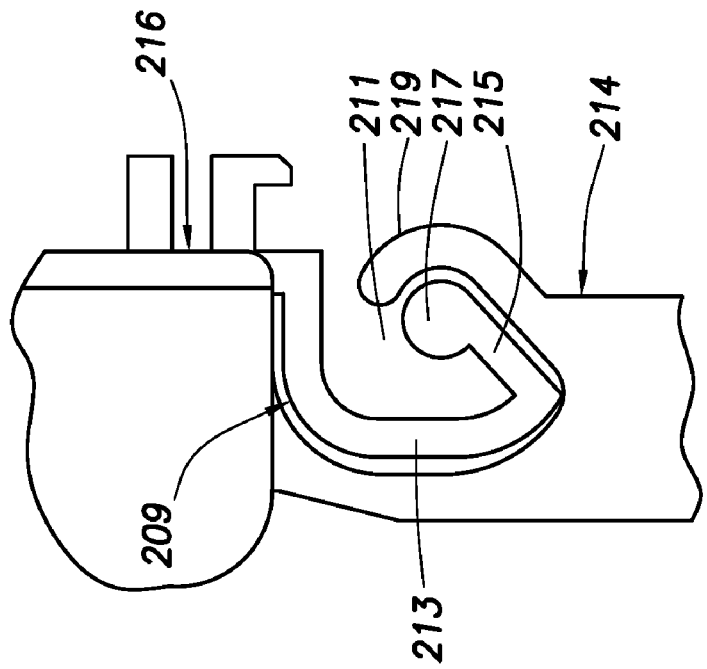
FIG. 5 is an enlarged view of one embodiment of a hinge in the closed position.

However, when side wall 216 is rotated to a closed position, as shown in FIG. 5, gap 207 is substantially eliminated. Elimination of gap 207 provides a tight fit for protrusion 209 in cavity 211. The tight fit helps provide the pressure necessary to hold side wall 216 in place and to push electrical components against back wall 220 to improve the effectiveness of the heat sink provided by back wall 220. The elimination of gap 207 when in the closed position is due to the shape of protrusion 209 and cavity 211. In particular, a cam profile shape is used for protrusion 209. A corresponding cam profile shape is then used for cavity 211 such that when in the closed position, protrusion 209 fits tightly in cavity 211 with little to no movement. As used herein, the term "cam profile" refers to a shape which does not produce a uniform profile or outline as it rotates. In other words, the profile of the object is dependent on the angular orientation of the object. The term is generically known to one of ordinary skill in the art with respect to cam and follower systems in which the irregular profile of the cam causes the follower to adjust its position as the cam rotates. While not employing a follower, the cam profile shape of protrusion 209 enables it to fit loosely in cavity 211 when in the open position, and to fit tightly in cavity 211 when rotated to the closed position.

As shown in FIGS. 4 and 5, the cam profile shape used in this exemplary embodiment has a curved segment 213 which ends abruptly at a right angle where it joins a straight segment 215. Protrusion 209 then ends with a rounded segment 217. Cavity 211 also includes lip 219 which is curved to match the curve of rounded segment 217. The interaction of lip 219 with rounded segment 217 helps prevent protrusion 209 from slipping out of position. Exemplary details for the cam profile shape shown in FIGS. 4 and 5, which provide the function described above for open and closed positions, are described below with respect to FIG. 6.

Figure 6:
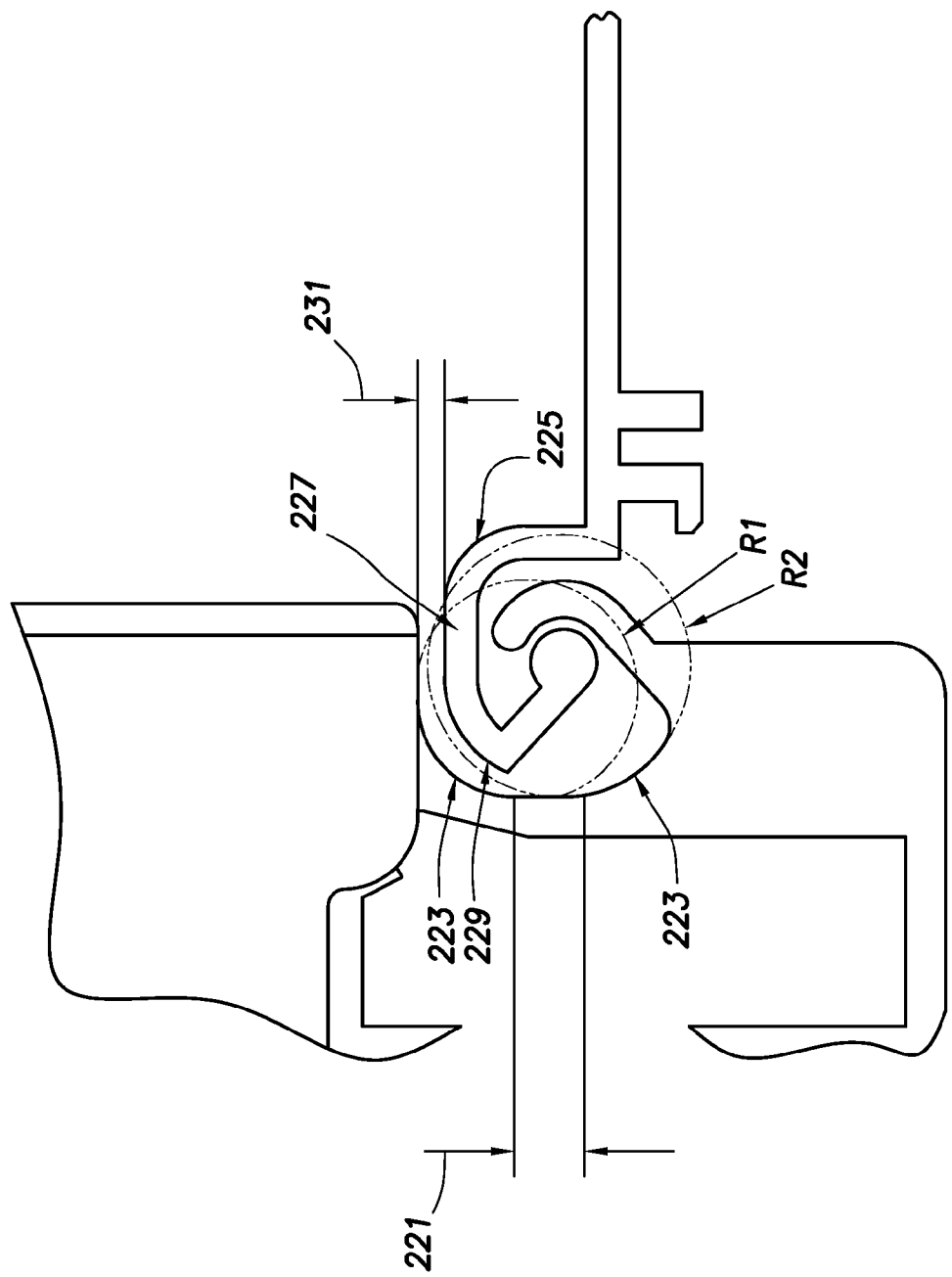
FIG. 6 is another enlarged view of one embodiment of a hinge in the open position.

FIG. 6 is an enlarged view of hinge 234 in the open position. As shown in FIG. 6, cavity 211 has a first curved area 233 having a first radius of curvature R1, a second curved area 223 having a second radius of curvature R2, and a flat transition segment 221 which transitions between the two curved areas. In particular, radius of curvature R1 is smaller than radius of curvature R2. Protrusion 209 has a corresponding first curved area 225, transition area 227, and second curved area 229. By having multiple curved areas, each with a different radius of curvature, sufficient clearance 231 is provided between protrusion 209 and cavity 211, when in the open position, that protrusion 209 fits loosely in cavity 211. Thus, assembling hinge 234 is simplified due to the loose fit. However, when in the closed position, protrusion 209 fits tightly in cavity 211.

Hence, hinge 234 reduces manufacturing costs by being manufactured as part of side walls 216/218 and base 214. In addition, hinge 234 does not increase the difficulty of assembling the hinge since the shape of hinge 234 is such that a loose fit is obtained with sufficient clearance in the open position, while a tight fit is obtained when in the closed position.

Figure 7:
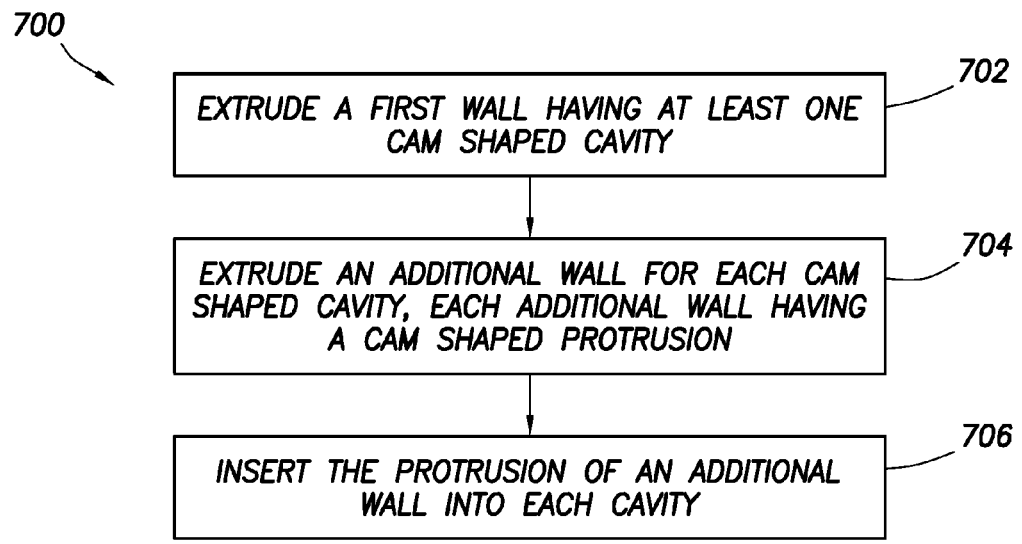
FIG. 7 is a flow chart of one embodiment of a method of manufacturing a hinge.
Figure 8:
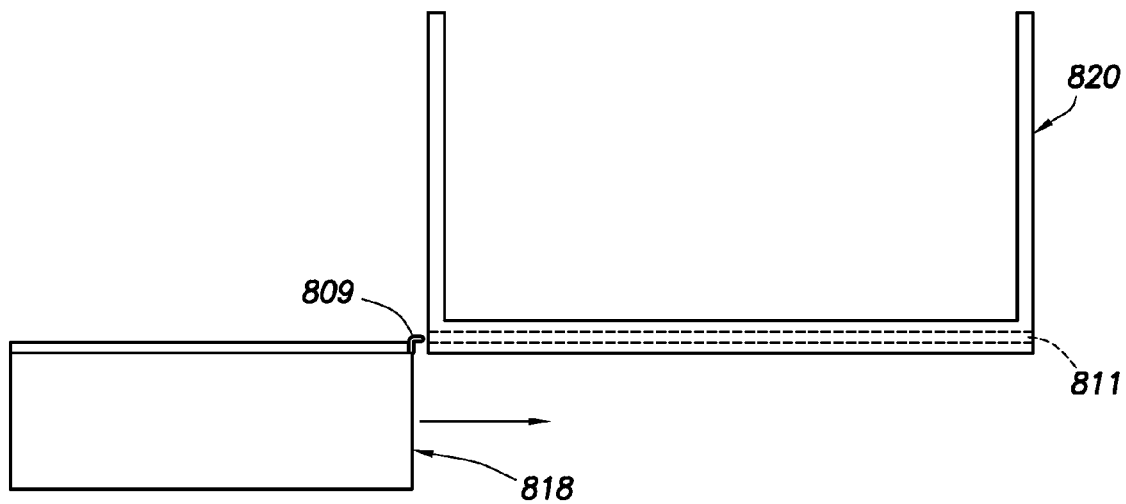
FIG. 8 is a block diagram depicting one embodiment of inserting a protrusion into a corresponding cavity.

FIG. 7 is a flow chart depicting one embodiment of a method 700 of manufacturing a hinge. Method 700 can be used to manufacture hinges, such as hinge 234 above. At 702, a first wall is extruded. In particular, the first wall is extruded with at least one cam shaped cavity as discussed above. At 704, an additional wall is extruded for each cam shaped cavity in the first wall. The additional wall is extruded with a cam shaped protrusion as discussed above. In particular, in some embodiments, two cavities are extruded in the first wall. Consequently, two additional walls are extruded, each having a cam shaped protrusion which substantially matches the cam shape of the corresponding cavity in the first wall. At 706, the cam shaped protrusion of the at least one additional wall is inserted into the at least one cavity of the first wall. In particular, in this embodiment, the protrusion of the at least one additional wall is aligned with a corresponding cavity at the end of the first wall and then slid through the length of first wall, as shown in FIG. 8. In particular, protrusion 809 of additional wall 818 is aligned with cavity 811 of the first wall 820. Protrusion 809 is oriented so that a gap is present between protrusion 809 and cavity 811 while being inserted. Additional wall 818 is then slid in the direction of arrow 850 to insert protrusion 809 into cavity 811.

Although specific embodiments have been illustrated and described herein, it will be appreciated by those of ordinary skill in the art that any arrangement, which is calculated to achieve the same purpose, may be substituted for the specific embodiment shown. For example, although embodiments of the present invention are described in relation to a remote unit enclosure having angled side walls or doors, it is to be understood that embodiments of the present invention can be implemented in other enclosures. This application is intended to cover any adaptations or variations of the present invention. Therefore, it is manifestly intended that this invention be limited only by the claims and the equivalents thereof.

What is claimed is:

1. A hinge comprising:
    a first member having a protrusion, wherein the protrusion has a cam profile shape; and
    a second member having a cavity operable to receive the protrusion, wherein a cam profile shape of the cavity corresponds to the cam profile shape of the protrusion such that, when the protrusion is in a first position, a gap is present between the second member and the protrusion and, when the protrusion is in a second position, substantially no gap is present between the second member and the protrusion
    wherein the cam profile shape of the cavity and the protrusion comprises:
        a straight segment; and
        a curved segment located at a first end of the straight segment;
    wherein the curved segment of the cavity and the curved segment of the protrusion each comprises:
        a first curved area having a first radius of curvature;
        a second curved area having a second radius of curvature; and
        a flat transition segment which transitions between the first and second curved areas.

2. The hinge of claim 1, wherein the first member is a door in an electronics enclosure and the second member is a base wall in the electronics enclosure.

3. The hinge of claim 1, wherein the first radius of curvature is smaller than the second radius of curvature.

4. The hinge of claim 1, wherein the protrusion includes a rounded segment coupled to a second end of the straight segment of the protrusion; and the second member includes a lip at a second end of the straight segment of the cavity; wherein a curvature of the rounded segment matches a curvature of the lip.

5. The hinge of claim 1, wherein the straight segment and the curved segment of each of the protrusion and the cavity form a right angle at the first end of the straight segment.

6. An electronics enclosure comprising:
a back wall to which one or more electronic components are secured, wherein the back wall includes a first cavity having a cam profile shape in a first side;
a first side wall operable to rotate between an open position and a closed position, the first side wall having a first protrusion with a cam profile shape which substantially matches the cam profile shape of the first cavity, wherein the first side wall is coupled to the first side of the back wall via insertion of the first protrusion into the first cavity; and
wherein, when the first side wall is in the open position, a gap is present between the back wall and the first protrusion and, when the first side wall is in the closed position, substantially no gap is present between the back wall and the first protrusion.

7. The electronics enclosure of claim 6 further comprising:
a second cavity having a cam profile shape in a second side of the back wall;
a second side wall operable to rotate between an open position and a closed position, the second side wall having a second protrusion with a cam profile shape which substantially matches the cam profile shape of the second cavity, wherein the second side wall is coupled to the second side of the back wall via insertion of the second protrusion into the second cavity;
when the second side wall is in the open position, a gap is present between the back wall and the second protrusions and, when the second side wall is in the closed position, substantially no gap is present between the back wall and the second protrusion.

8. The electronics enclosure of claim 6, wherein the first cavity extends the length of the first side of the back wall, the second cavity extends the length of the second side of the back wall, the first protrusion extends the length of the first side wall, and the second protrusion extends the length of the second side wall.

9. The electronics enclosure of claim 6, wherein the cam profile shape of the first cavity and the cam profile shape of the first protrusion comprises:
a straight segment; and
a curved segment located at a first end of the straight segment.

10. The electronics enclosure of claim 9, wherein the curved segment of the cam profile shape comprises:
a first curved area having a first radius of curvature;
a second curved area having a second radius of curvature; and
a flat transition segment which transitions between the first and second curved areas.

11. The electronics enclosure of claim 10, wherein the first radius of curvature is smaller than the second radius of curvature.

12. The electronics enclosure of claim 9, wherein the first protrusion includes a rounded segment coupled to a second end of the straight segment; and the back wall includes a lip at a second end of the straight segment of the first cavity; wherein a curvature of the rounded segment matches a curvature of the corresponding lip.

13. The electronics enclosure of claim 9, wherein the straight segment and the curved segment form a right angle at the first end of the straight segment.

14. A distributed antenna system comprising:
a host unit;
a transport mechanism; and
at least one remote unit communicatively coupled to the host unit via the transport mechanism;
wherein each of the host unit and the at least one remote unit are operable to receive a radio frequency (RF) signal and transport the received RF signal over the transport mechanism;
wherein each of the at least one remote units comprises:
one or more electronic components; and
an enclosure operable to enclose the one or more electronic components, wherein the enclosure comprises:
a back wall to which the one or more electronic components are secured, wherein the back wall includes a first cavity having a cam profile shape in a first side; and
a first side wall operable to rotate between a first position and a second position, the first side wall having a first protrusion with a cam profile shape which substantially matches the cam profile shape of the first cavity, wherein the first side wall is coupled to the first side of the back wall via insertion of the first protrusion into the first cavity;
wherein, when the first side wall is in the first position, a gap is present between the back wall and the first protrusion and, when the first side wall is in the second position, substantially no gap is present between the back wall and the first protrusion.

15. The distributed antenna system of claim 14, wherein the enclosure further comprises:
a second cavity having a cam profile shape in a second side of the back wall; and
a second side wall operable to rotate between the first position and the second position, the second side wall having a second protrusion with a cam profile shape which substantially matches the cam profile shape of the second cavity, wherein the second side wall is coupled to the second side of the back wall via insertion of the second protrusion into the second cavity; and
wherein, when the second side wall is in the first position, a gap is present between the back wall and the second protrusion and, when the second side wall is in the second position, substantially no gap is present between the back wall and the second protrusion.

16. The distributed antenna system of claim 15, wherein the first cavity extends the length of the first side of the back wall, the second cavity extends the length of the second side of the back wall, the first protrusion extends the length of the first side wall, and the second protrusion extends the length of the second side wall.

17. The distributed antenna system of claim 14, wherein the cam profile shape of the first cavity and the cam profile shape of the first protrusion comprises:
a straight segment; and
a curved segment located at a first end of the straight segment.

18. The distributed antenna system of claim 17, wherein the curved segment of the cam profile shape comprises:
a first curved area having a first radius of curvature;

a second curved area having a second radius of curvature; and a flat transition segment which transitions between the first and second curved areas.

19. The distributed antenna system of claim 18, wherein the first radius of curvature is smaller than the second radius of curvature.

20. The distributed antenna system of claim 17, wherein the first protrusion includes a rounded segment coupled to a second end of the straight segment; and the back wall includes a lip at a second end of the straight segment of the first cavity; wherein a curvature of the rounded segment matches a curvature of the corresponding lip.

21. The distributed antenna system of claim 17, wherein the straight segment and the curved segment form a right angle at the first end of the straight segment.

22. A method of manufacturing a hinge, the method comprising:

extruding a first wall having at least one cam shaped cavity comprised of a straight segment and a curved segment located at a first end of the straight segment;

extruding an additional wall for each of the at least one cam shaped cavities, wherein each of the additional walls is extruded with a cam shaped protrusion comprised of a straight segment and a curved segment located at a first end of the straight segment; and inserting the protrusion of the additional wall into a corresponding cam shaped cavity of the first wall;

wherein the curved segment of each of the cam shaped cavity and the cam shaped protrusion is comprised of:

a first curved area having a first radius of curvature;

a second curved area having a second radius of curvature; and a flat transition segment which transitions between the first and second curved areas.

23. The method of manufacturing a hinge according to claim 22, wherein the first radius of curvature is smaller than the second radius of curvature.

* * * * *